United States Patent
An et al.

(10) Patent No.: US 12,207,440 B2
(45) Date of Patent: Jan. 21, 2025

(54) CAM SYSTEM FOR LIQUID COOLED COMPUTING SYSTEM

(71) Applicant: ZT Group Int'l, Inc.

(72) Inventors: Chen An, Bergenfield, NJ (US); Mahesh Kumar Varrey, Clifton, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 200 days.

(21) Appl. No.: 18/149,202

(22) Filed: Jan. 3, 2023

(65) Prior Publication Data
US 2024/0224466 A1    Jul. 4, 2024

(51) Int. Cl.
| | |
|---|---|
| *H05K 7/20* | (2006.01) |
| *F16L 37/12* | (2006.01) |
| *F16L 37/30* | (2006.01) |
| *H05K 7/14* | (2006.01) |

(52) U.S. Cl.
CPC .......... *H05K 7/20272* (2013.01); *F16L 37/12* (2013.01); *F16L 37/30* (2013.01); *H05K 7/1489* (2013.01); *H05K 7/20772* (2013.01)

(58) Field of Classification Search
None
See application file for complete search history.

(56) References Cited

U.S. PATENT DOCUMENTS

| | | | |
|---|---|---|---|
| 7,515,428 B2 * | 4/2009 | Tang | H05K 7/1432 439/160 |
| 7,670,157 B2 * | 3/2010 | Miyamoto | H01R 13/62938 439/157 |
| 11,553,627 B1 * | 1/2023 | Gregory | H05K 7/20781 |
| 2019/0178430 A1 * | 6/2019 | Wolf | F16B 2/185 |

* cited by examiner

*Primary Examiner* — Mukundbhai G Patel
(74) *Attorney, Agent, or Firm* — POLSINELLI PC

(57) ABSTRACT

A cam system for a liquid cooled computing unit with blind-mate quick disconnects include a cam and a cam guide. The cam guide is operable to engage with the cam. The cam guide includes a bearing guide and a fixed guide. The cam engages first with the bearing guide then engages with the fixed guide to a latched configuration. When the cam engages with the cam guide and transitions to the latched configuration, the cam translates a chassis of the computing unit along a longitudinal axis to blind-mate the quick disconnects.

19 Claims, 10 Drawing Sheets

CAM SYSTEM FOR LIQUID COOLED COMPUTING SYSTEM

FIELD

The present disclosure relates generally to a cam guide operable to be installed in a liquid cooled computing system.

BACKGROUND

Computing systems such as modular servers and/or information handling systems are continually improving and becoming more powerful. The chips, for example artificial intelligence chips, are becoming more powerful, which leads to increased thermal design power. To manage the heat generated by the chips, liquid cooling is becoming a main strain on the hyperscale server industry.

BRIEF DESCRIPTION OF THE DRAWINGS

Implementations of the present technology will now be described, by way of example only, with reference to the attached figures, wherein.

DETAILED DESCRIPTION

Figure 1A:
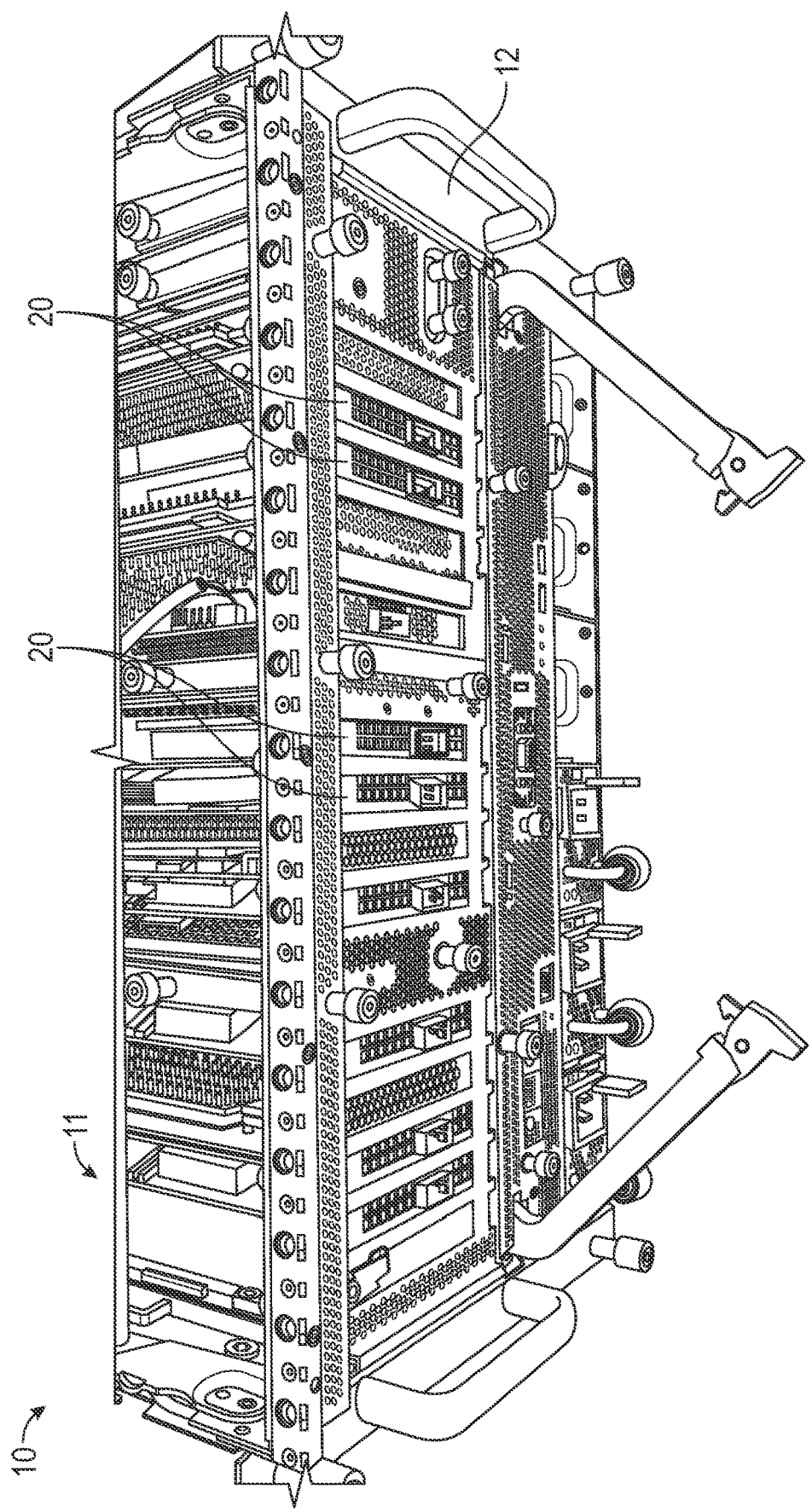
FIG. 1A is a front perspective view of a computing system with a computing unit according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a cam system for a liquid cooled computing system with blind-mate quick disconnects. The liquid flow rate is a key to allowing the heat to transfer faster, thus a high flow rate blind-made quick disconnect may be utilized. To prevent leaking, the travel distance and mating force of the conventional quick disconnect can become challenging to the fastener design for the computing system. The computing system may utilize a cam handle for engaging and force saving. However, due to the large mating force, an issue may be that with the flow rate increase the friction between the cam and cam guide also grows exponentially. As a result, the cam guide disclosed herein provides enough strength and at the same time does not create too much friction while engaging the cam.

The cam system combines a low friction bearing guide and a fixed guide. Peak engaging force for a computing quick disconnect and a fluid quick disconnect can happen at the first 40% of travel. In the very beginning stage, the force can be largely due to the liquid pressure and the cam beginning engaging angle. At the very beginning stage, the cam guide needs to significantly reduce the friction to allow for a smooth engagement. After the cam passes the peak resistance force section, the cam handle push force will significantly reduce. At that stage, the fixed guide can engage with the cam and provide extra strength. The hybrid design of utilizing both a bearing guide and a fixed guide can help reduce the engaging force but still maintain the end status (e.g., chassis engaged status) with sufficient strength.

The disclosure now turns to FIG. 1A, which illustrates an example of a computing system 10 to be used, for example, in a liquid cooled modular server and/or information handling system. The computing system 10 can include one or more computing units 11. The computing unit(s) 11 can include a chassis 12 operable to contain a plurality of components 20 such as one or more processors, hard drives, motherboards, and liquid cooling systems. Additional components can be disposed within the chassis 12 without deviating from the scope of the disclosure. FIG. 1A illustrates a front side of the computing system 10.

Thermal management of computing systems 10 can be critical to the performance and time between failures for the computing system 10. As computing systems 10 such as modular servers and/or information handling systems can have higher temperature environments, air cooling can be insufficient to adequately cool down the computing systems 10. Accordingly, liquid cooling systems utilizes heat transfer fluid to pass through the computing system 10 and lower the temperature of the components of the computing system 10 to within a desired threshold.

Figure 1B:
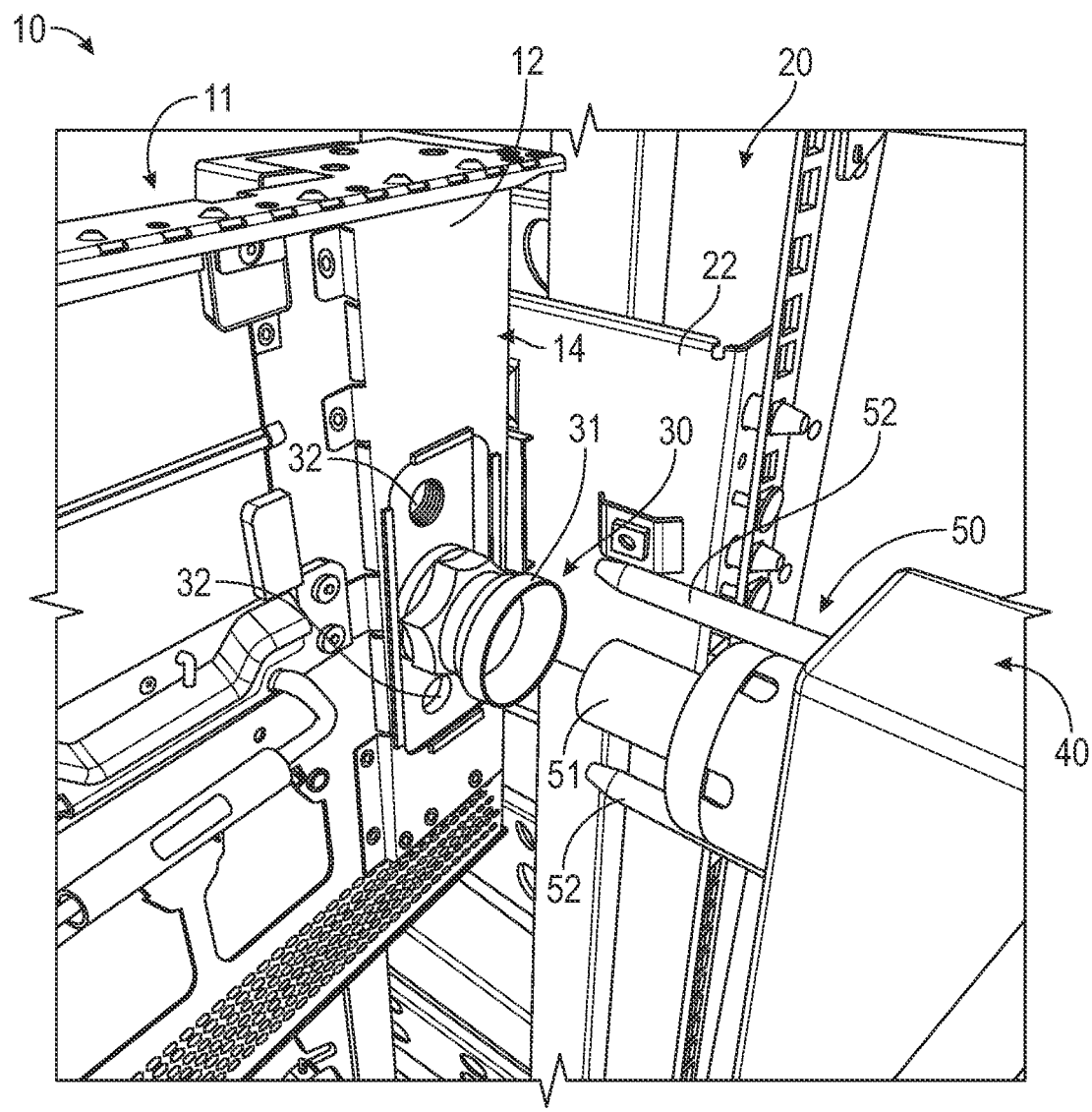
FIG. 1B is a rear perspective view of the computing system of FIG. 1A, showing blind-mate disconnects for a fluid component of the computing unit.

FIG. 1B illustrates a rear side of the computing system 10. As shown in FIG. 1B, the computing unit(s) 11 of the computing system 10 can include a liquid cooling system with a computing quick disconnect 30. The computing quick disconnect 30 is operable to fluidly couple with a fluid component 40 which is operable to transfer fluid between the liquid cooling system for the computing unit 20. The fluid component 40 includes a fluid quick disconnect 50 is operable to fluidly couple with the computing quick disconnect 30 to provide the fluid via the computing quick disconnect 30. For example, as illustrated in FIG. 1B, a fluid insert 51 is operable to be received by a computing receiver 31. The fluid can flow out of the fluid insert 51 into the computing receiver 31 and into the liquid cooling system for the computing unit 20. In at least one example, the fluid insert 51 can be plugged into the computing receiver 31. Accordingly, the computing quick disconnect 30 and the fluid quick disconnect 50 can quickly and easily mate and provide a seal such that the fluid does not leak.

As illustrated in FIG. 1B, the computing quick disconnect 30 can be adjacent to a rear end of the computing unit 20 such that the computing quick disconnect 30 and the fluid quick disconnect are blind-mate quick disconnects.

In at least one example, as illustrated in FIG. 1B, the fluid quick disconnect 50 can include one or more fluid fasteners 52 extending from the fluid component 40. The fluid fasteners 52 can be operable to be coupled with computing fasteners 32 to assist in maintaining the mating of the fluid insert 51 and the computing receiver 31. In at least one example, the fluid fasteners 52 can be coupled with the computing fasteners 32 to prevent rotation or translation between the fluid insert 51 and the computing receiver 31. In some examples, the fluid fasteners 52 can include rods that are operable to be received in apertures formed by the computing fasteners 32.

As illustrated in FIG. 1B, the computing unit 11 can be coupled with a housing 20 of the computing system 10. For example, as shown in FIG. 1B, the housing 20 can include an outer rail 22. The outer rail 22 is operable to receive a portion of a side wall 14 of the chassis 12 of the computing system 10. In at least one example, as illustrated in FIG. 1B, the computing unit 11 can be received in and coupled with the housing 20 by sliding and/or translating the computing system 10 along the outer rail 22. In at least one example, the housing 20 can be operable to receive one computing unit 11. In some examples, the housing 20 can be operable to receive a plurality of computing units 11.

Figure 2A:
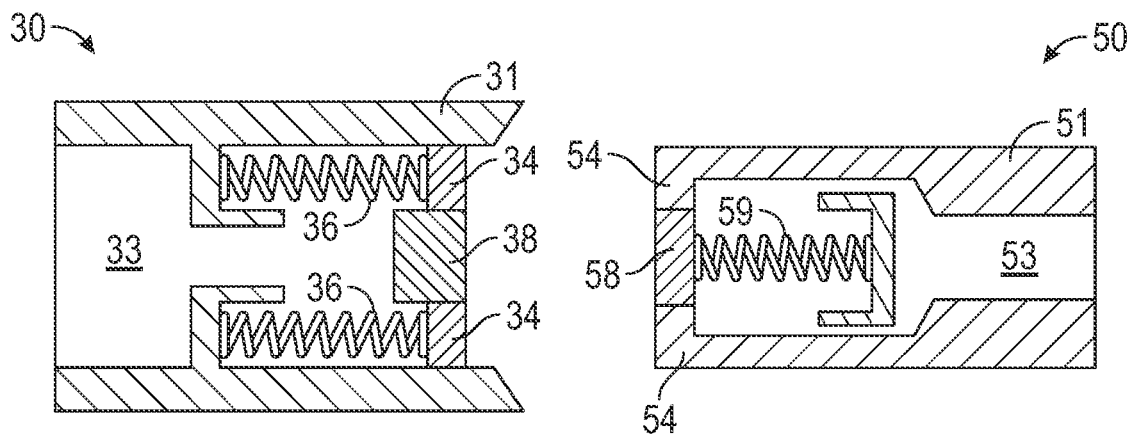
FIGS. 2A, 2B, and 2C are diagrams of quick disconnects mating.
Figure 2B:
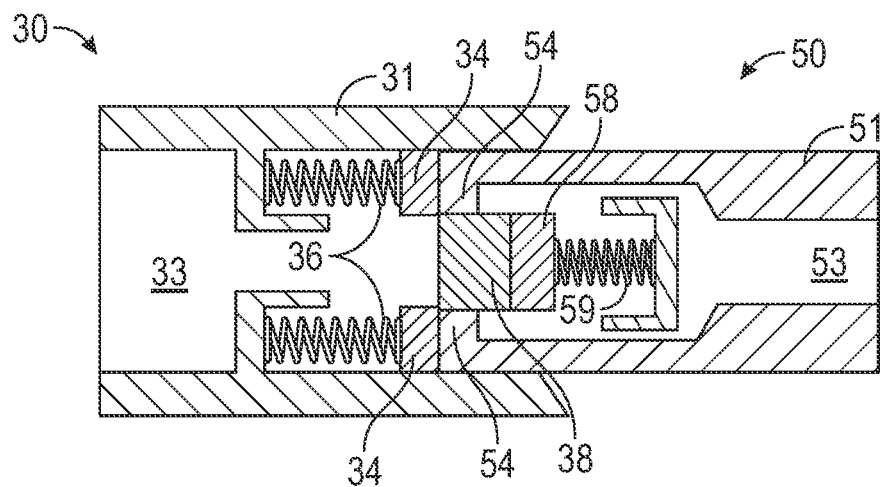
Figure 2C:
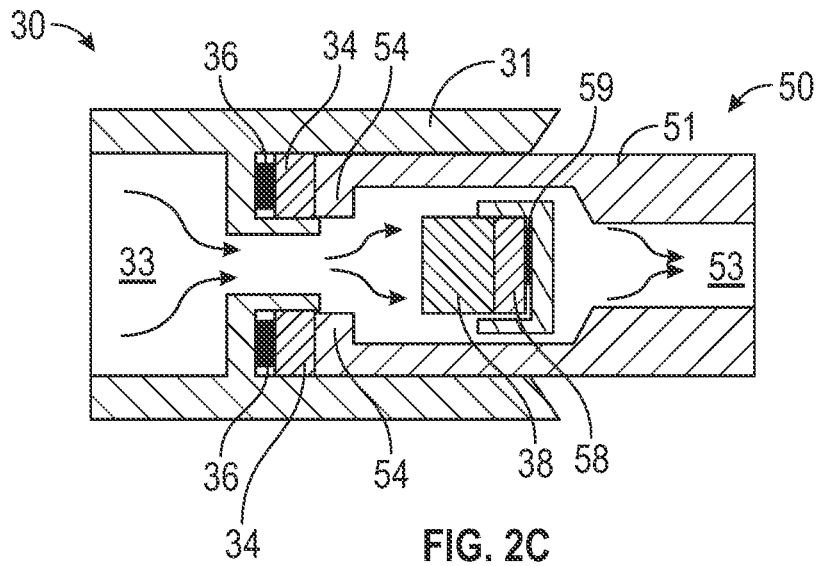

FIGS. 2A-2C illustrate the mating between the fluid quick disconnect 50 and the computing quick disconnect 30. As illustrated in FIG. 2A, the computing receiver 31 of the computing quick disconnect 30 includes an annulus 33 operable to permit fluid flow therethrough. The computing receiver 31 includes a central block 38 with a releasing sleeve 34 disposed around the central block 38. The releasing sleeve 34 can abut against one or more springs 36. In the closed configuration as shown in FIG. 2A, the central block 38 and the releasing sleeve 34 are aligned to prevent fluid flow out from the annulus 33 of the computing receiver 31. Accordingly, in the closed configuration, the central block 38 and the releasing sleeve 34 prevent any leaking out of fluid from the liquid cooling system via the computing receiver 31.

The fluid insert 51 of the fluid quick disconnect 50 can include an annulus 53 operable to permit fluid flow therethrough. The fluid insert 51 can include side blocks 54 and a central release 58. The central release 58 can abut against one or more springs 59. In the closed configuration as shown in FIG. 2A, the side blocks 54 and the central release 58 are aligned to prevent fluid flow out from the annulus 53 of the fluid insert 51. Accordingly, in the closed configuration, the central release 58 and the side blocks 54 prevent any leaking out of fluid from the fluid component 40 via the fluid quick disconnect 50.

As illustrated in FIG. 2B, the fluid insert 51 is received in the computing receiver 31. When engaged, the central block 38 of the computing receiver 31 is operable to be aligned with the central release 58 of the fluid insert 51, and the releasing sleeve 34 of the computing receiver 31 is operable to be aligned with the side blocks 54 of the fluid insert 51. As the fluid insert 51 is pushed into the computing receiver 31, the central block 38 abuts against the central release 58 and enacts a force onto the central release 58. As the central block 38 is configured to remain in place, the central release 58 is pushed into the fluid insert 51, and the one or more springs 59 compress. Similarly, as the fluid insert 51 is pushed into the computing receiver 31, the side blocks 54 abut against the releasing sleeve 34 and enact a force onto the releasing sleeve 34. As the side blocks 54 are operable to remain in place, the releasing sleeve 34 is pushed into the computing receiver 31, and the one or more springs 36 compress. The central block 38 then becomes misaligned with the releasing sleeve 34, and the side blocks 54 becomes misaligned with the central release 58.

As illustrated in FIG. 2C, the fluid insert 51 is fully received in the computing receiver 31, and the fluid quick disconnect 50 is fully engaged with the computing quick disconnect 30. The central block 38 are misaligned with the releasing sleeve 34, and the side blocks 54 are misaligned with the central release 58. As such, the annulus 33 of the computing receiver 31 is in fluid communication with the annulus 53 of the fluid insert 51. The fluid can then flow between the fluid component 40 and the computing unit 20.

Figure 3A:
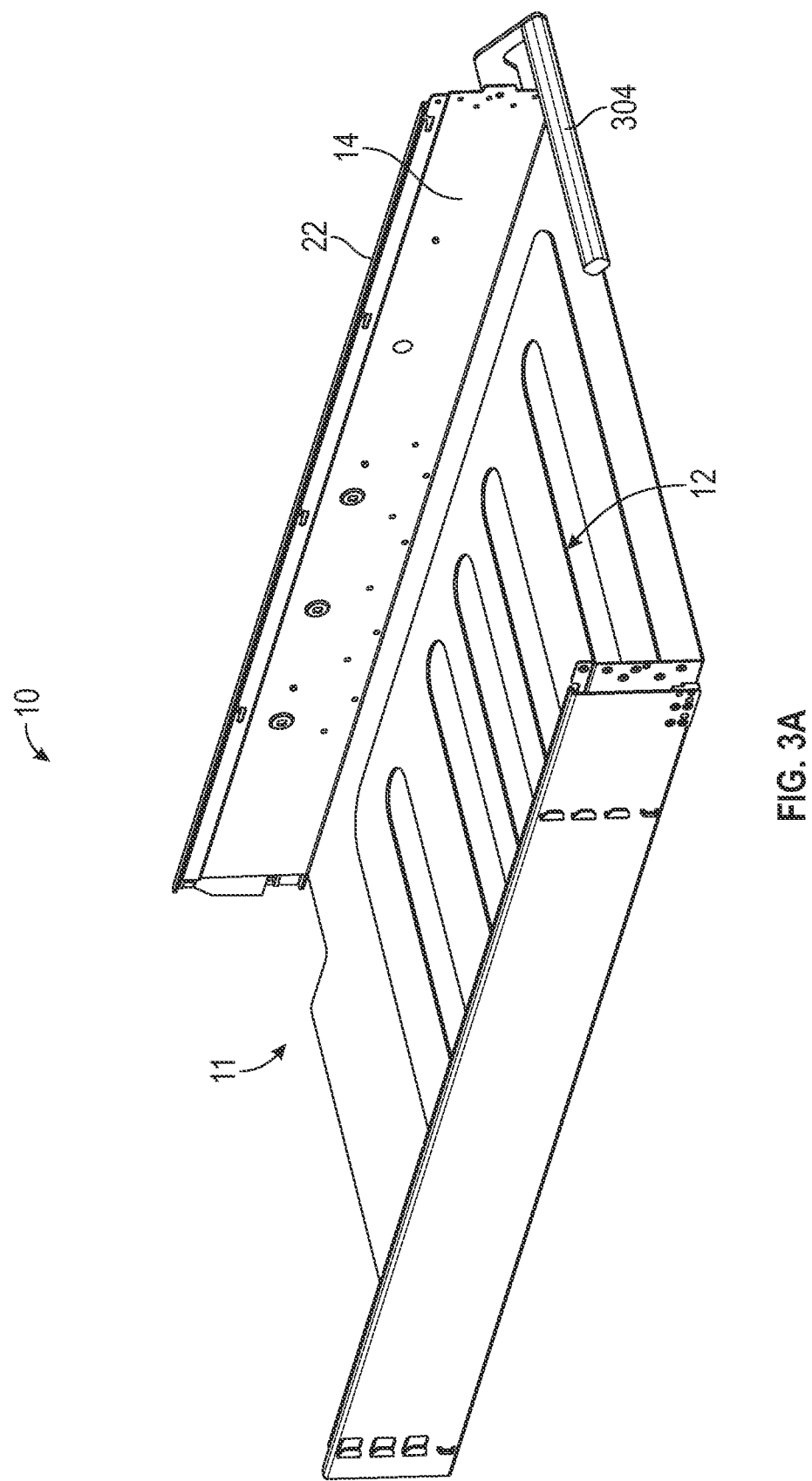
FIG. 3A is a perspective view of a chassis of a computing unit coupling with an outer rail.

FIG. 3A illustrates a computing unit 11 of a computing system 10 which includes a chassis 12 operable to receive one or more computing components 20 (e.g., processing unit, liquid cooling system with the computing quick disconnect 30, etc.; not shown here). The chassis 12 is operable to be slid and translate within the body 12 of the computing system 10. The chassis 12 of the computing unit 11 can include an outer rail 22 which is operable to receive the chassis 12 (e.g., a side wall 14 of the chassis 12) such that the chassis 12 is operable to translate on the outer rail 22 along a longitudinal axis. As the chassis 12 translates on the outer rail 22, the computing quick disconnect 30 can mate with the fluid quick disconnect 50.

Figure 3B:
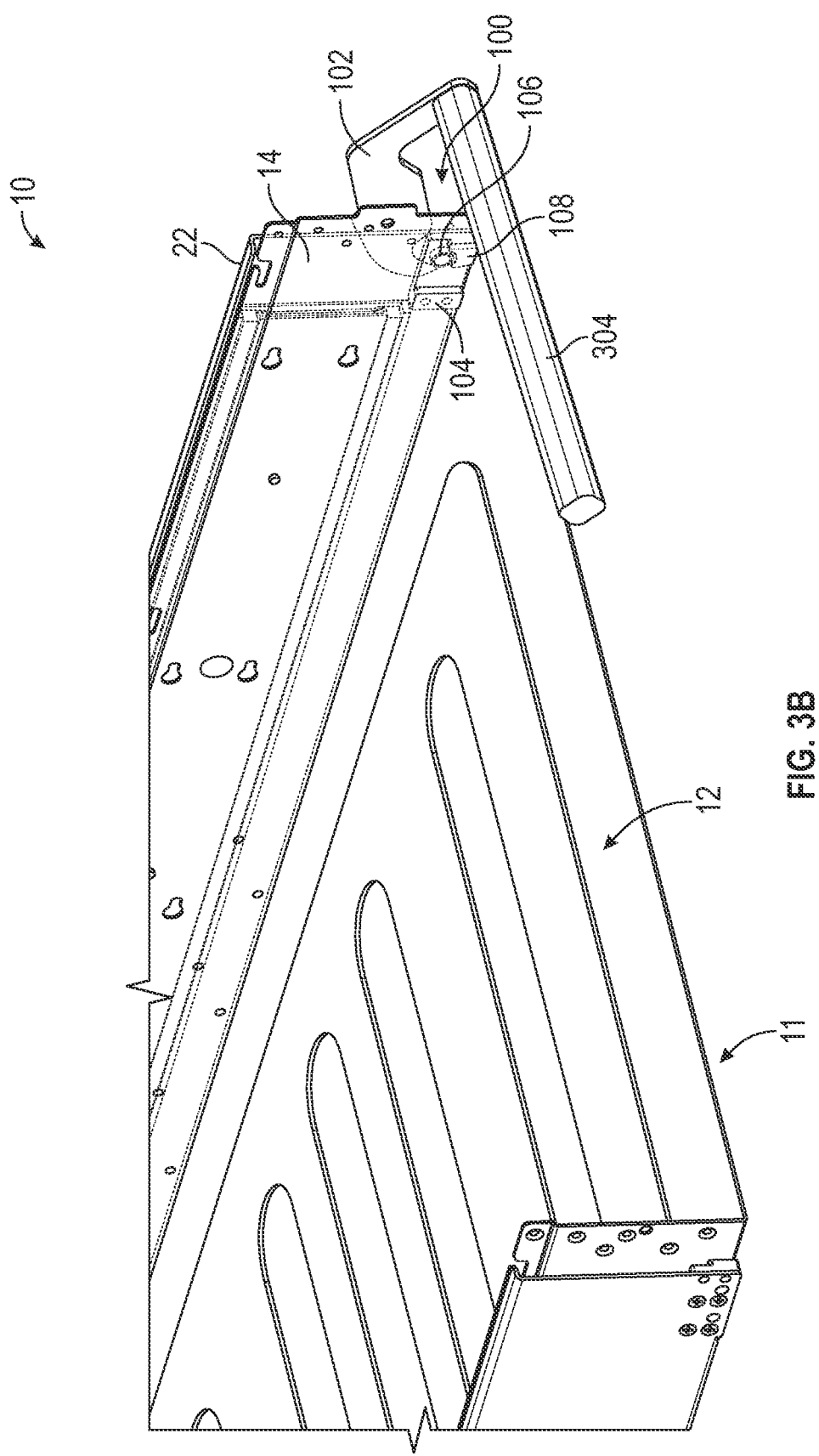
FIG. 3B is a perspective view of the chassis and the outer rail of FIG. 3A, showing a cam system.

FIG. 3B illustrates a cam system 100 operable to convert rotary motion into linear motion. In doing so, the cam system 100 assists in translating the chassis 12 on the outer rail 22 so that the computing quick disconnect 30 can fluidly couple with the fluid quick disconnect 50. The cam system 100 can also assist in securing the chassis 12 in place so that the chassis 12 does not translate on the outer rail 22 and cause the computing quick disconnect 30 to separate from the fluid quick disconnect 50. As illustrated in FIG. 3B, the cam system 100 is adjacent a front end of the chassis 12 opposite the rear end of the chassis 12 where the computing quick disconnect 30 is positioned.

High flowrate quick disconnects (e.g., computing quick disconnect 30 and fluid quick disconnect 50) can have large mating forces due to large spring loads, pressure from the fluid inside the manifolds, incompressibility of the fluid, and/or large mating distance. Conventional latching mechanisms with cams are not suitable due to the high friction from engaging the conventional cam system which can subject the conventional cam system to extensive wear and tear. Accordingly, the wear and tear on the conventional cam system can reduce the performance and effort saving function of the conventional cam system.

To address the large mating forces, the cam system 100 as disclosed herein includes a cam 102 and a cam guide 104 operable to engage with the cam 102 which includes a bearing guide 106 and a fixed guide 108. In at least one example, as illustrated in FIG. 3B, the cam 102 can include a handle 304 which a user can grasp and exert rotational force on the cam 102.

Figure 3C:
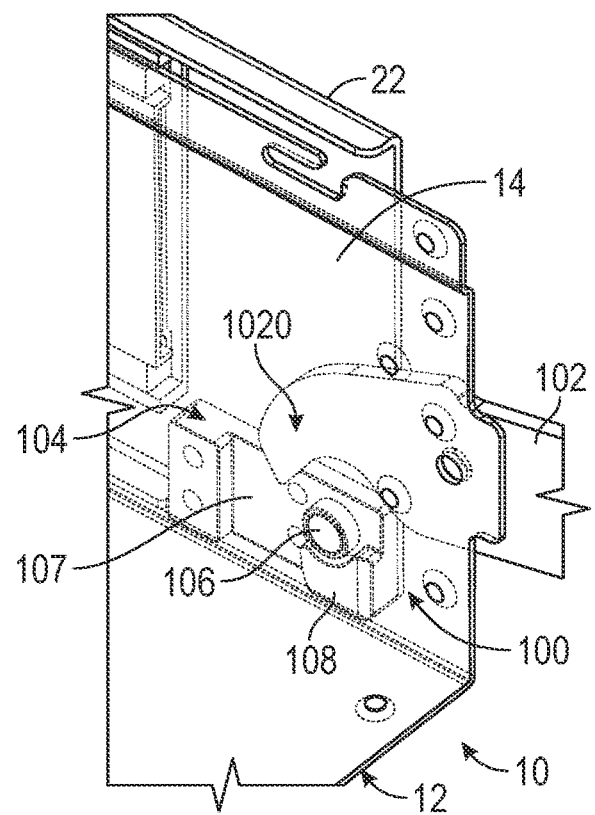
FIG. 3C is an enlarged view of the cam system of FIG. 3B.

As illustrated in FIG. 3C, the cam 102 can include an engagement portion 1020 which is operable to engage with the cam guide 104. In at least one example, as illustrated in FIG. 3C, the cam guide 104 can be coupled with the outer rail 22, and the cam 102 can be coupled with the side wall 14 of the chassis 12.

Figure 4:
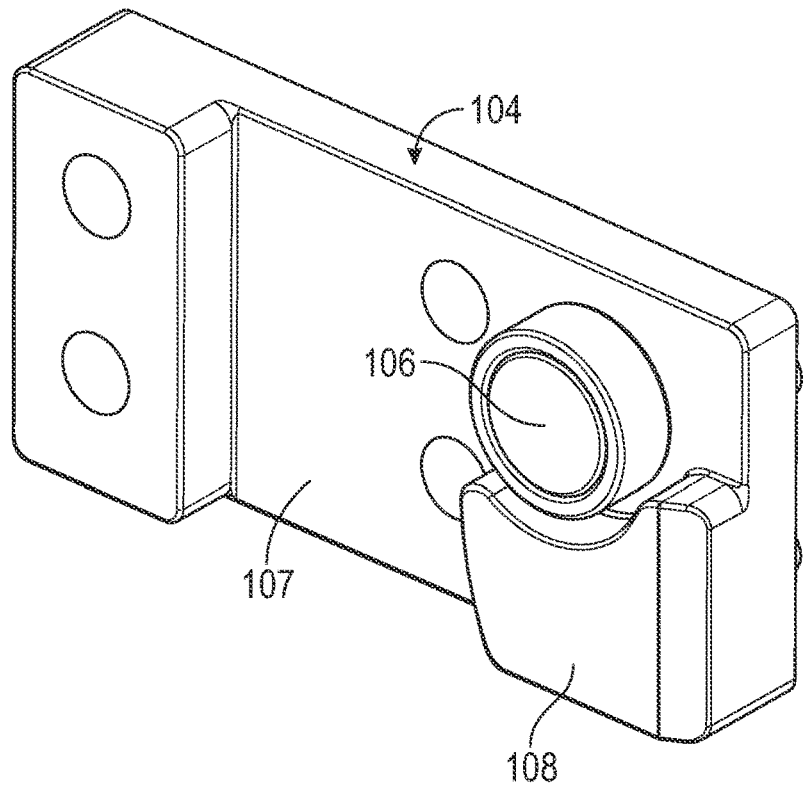
FIG. 4 is a perspective view of a cam guide.

As illustrated in FIG. 4, the cam guide 104 includes the bearing guide 106 and the fixed guide 108. The bearing guide 106 is operable to rotate. In some examples, the bearing guide 106 can include a sleeve bearing and/or a roller bearing. When the cam 102 engages the bearing guide 106, the bearing guide 106 is operable to rotate as the cam 102 moves along the bearing guide 106. Accordingly, the bearing guide 106 is operable to reduce initial friction. With the bearing guide 106 being rotatable, a smaller bearing guide 106 can be utilized to handle the load. For example, for a bearing guide 106 with a diameter of about 11 millimeters, the bearing guide 106 can handle a dynamic radial load capacity of about 270 pounds at 120 rpm. Also for example, for a bearing guide 106 with a diameter of about 9 millimeters, the bearing guide 106 can handle a load between about 75 kilogram-force and about 80 kilogram-force.

The fixed guide 108 can be configured to remain fixed and motionless. In at least one example, as illustrated in FIG. 4, the fixed guide 108 can be provided on a die-cast component 107 which is coupled with the outer rail 22 of the computing system 10 operable to receive the chassis 12 of the computing unit 11. In at least one example, the bearing guide 106 can be rotatably mounted to the die-cast component 107. In at least one example, the fixed guide 108 can be formed from the die-cast component 107. In some examples, the fixed guide 108 can be coupled to the die-cast component 107. The fixed guide 108 can be operable to support the large impact loads once the quick disconnects 30, 50 are engaged completely at the end of latching.

With the bearing guide 106 and the fixed guide 108, the cam guide 104 has a hybrid design operable to reduce initial friction loading by the bearing guide 106 and a rigid load bearing surface by the fixed guide 108 at the end of engagement to handle high impact loads.

FIGS. 5A-5F illustrate the engagement of the cam 102 with the cam guide 104 to translate the chassis 12 to align and couple the blind-mate quick disconnects 30, 50 and latch when the blind-mate quick disconnects 30, 50 are mated. As illustrated in FIGS. 5A-5F, the cam 102 can include a handle 304 which is coupled with a handle portion 3040 of the cam 102. In some examples, the cam 102 only includes the handle portion 3040 to function as the handle for the user to grasp.

Figure 5A:
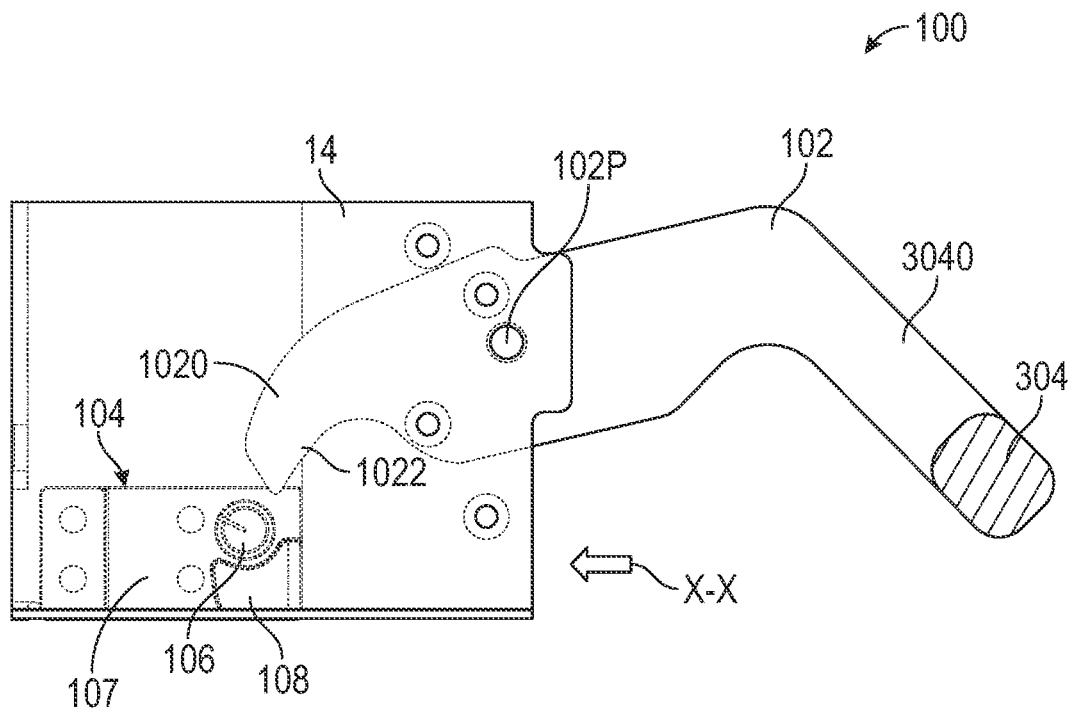
FIGS. 5A, 5B, 5C, 5D, 5E, and 5F illustrate engagement of a cam with a cam guide of the cam system.

As illustrated in FIG. 5A, the chassis 12 translates along the longitudinal axis X-X of the outer rail 22. The cam 102 is not yet positioned to engage with the cam guide 104. In at least one example, the user can push against the chassis 12 itself to translate the chassis 12 along the outer rail 22. In some examples, the user can push against the handle 304 of the cam 102 to translate the chassis 12 along the outer rail 22.

Figure 5B:
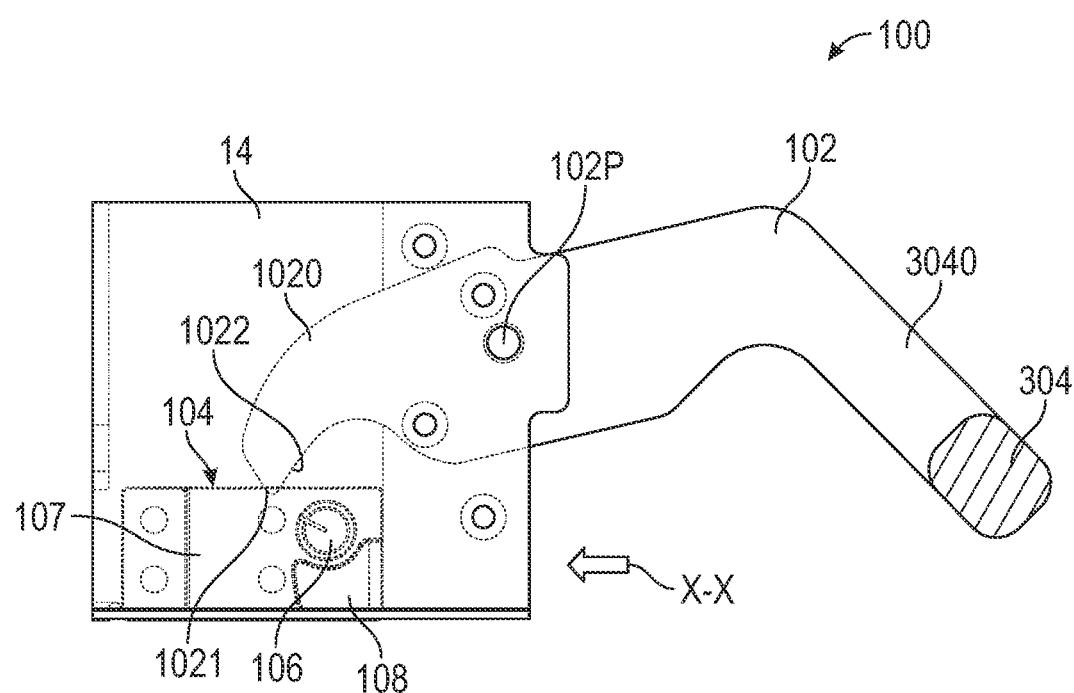

As illustrated in FIG. 5B, the chassis 12 has translated along the longitudinal axis X-X of the outer rail 22 enough of a distance so that the engagement component 1020 of the cam 102 is aligned with and/or past the bearing guide 106 of the cam guide 104.

Figure 5C:
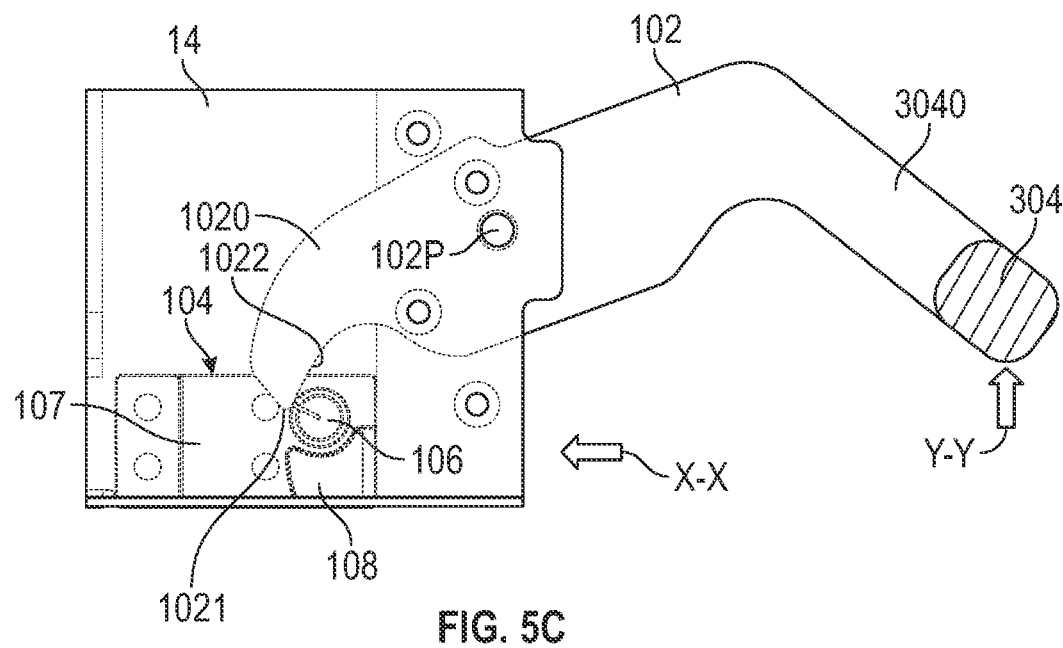

As illustrated in FIG. 5C, the cam 102, being rotatably coupled with the side wall 14 of the chassis 12 about a rotation axis 102P, is operable to be rotated about the rotation axis 102P to transition towards the latched configuration. The engagement component 1020 of the cam 102 has an engagement surface 1022 which ends at a tip 1021. As illustrated in FIG. 5C, the cam 102 is rotated about the rotation axis 102P due to a force pushing the handle 304 in a vertical axis Y-Y. As the cam 102 rotates, the engagement surface 1022 of the cam 102 first engages with the bearing guide 106.

Figure 5D:
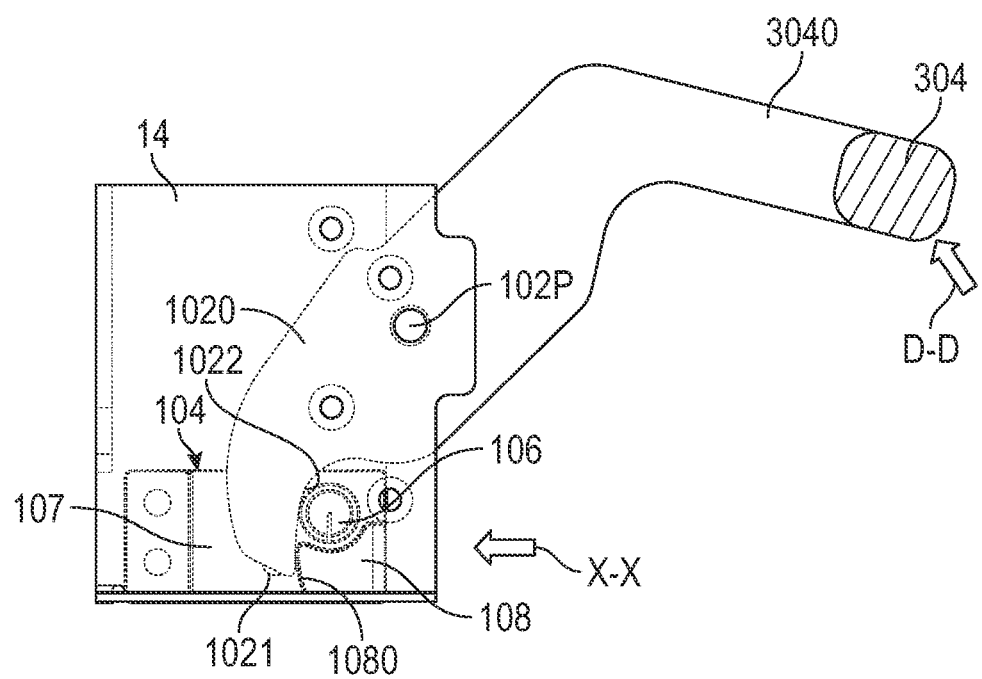

As illustrated in FIG. 5D, the cam 102 is further rotated about the rotation axis 102P. The engagement surface 1022 of the cam 102 has a compound curve so that when the engagement surface 1022 of the engagement component 1020 engages with the cam guide 104—in this case the bearing guide 106—and transitions towards the latched configuration, the cam 102 translates the chassis 12 of the computing system 10 along the longitudinal axis X-X. In other words, the cam converts the rotational force to a linear force due to the compound curve of the engagement surface 1022. As the engagement component 1020 rotatably slides along the bearing guide 106, the bearing guide 106 is operable to rotate. Accordingly, the bearing guide 106 reduces the initial friction loading as the blind-mating disconnects 30, 50 engage.

As illustrated in FIG. 5D, the cam 102 has rotated so that the tip 1021 has moved past the bearing guide 106 and has then engaged with the fixed guide 108 to transition towards a latched configuration. The engagement surface 1022 abuts against a fixed surface 1080 of the fixed guide 108.

Figure 5E:
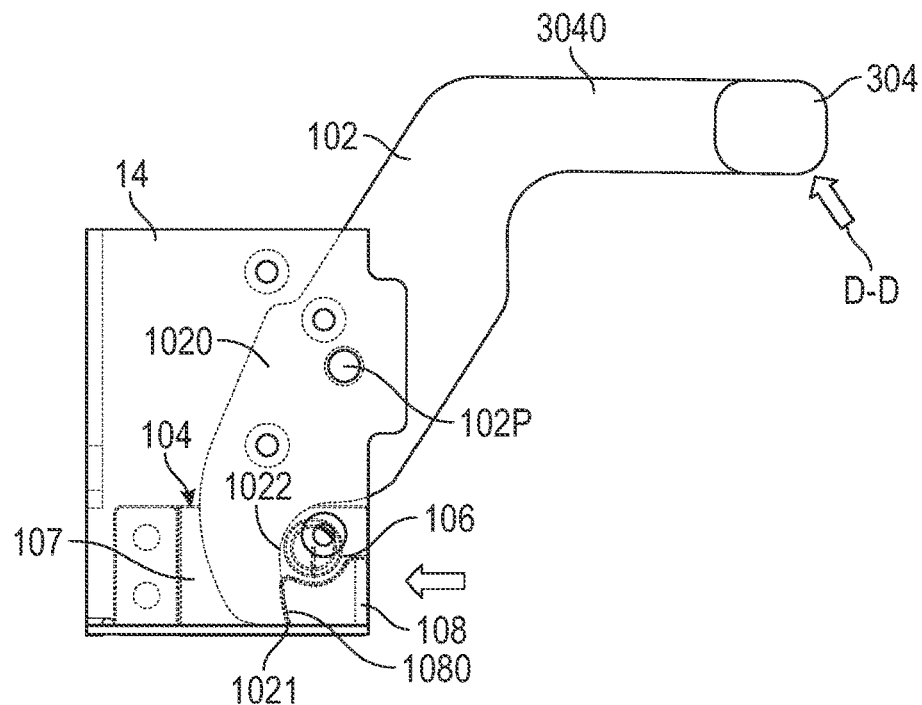

As illustrated in FIG. 5E, the cam 102 is fully engaged with the fixed guide 108 so that the cam 102 is in the latched configuration. At the latched configuration, the computing quick disconnect 30 and the fluid quick disconnect 50 are coupled and permit fluid flow therebetween. The user has enacted a force in a direction D-D on the handle 304 of the cam 102 to fully rotate the cam 102 along the rotation axis 102P so that the cam 102 is fully engaged with the cam guide 104. Also, the chassis 12 has translated along the longitudinal axis X-X sufficiently to couple the computing quick disconnect 30 with the fluid quick disconnect 50.

Figure 5F:
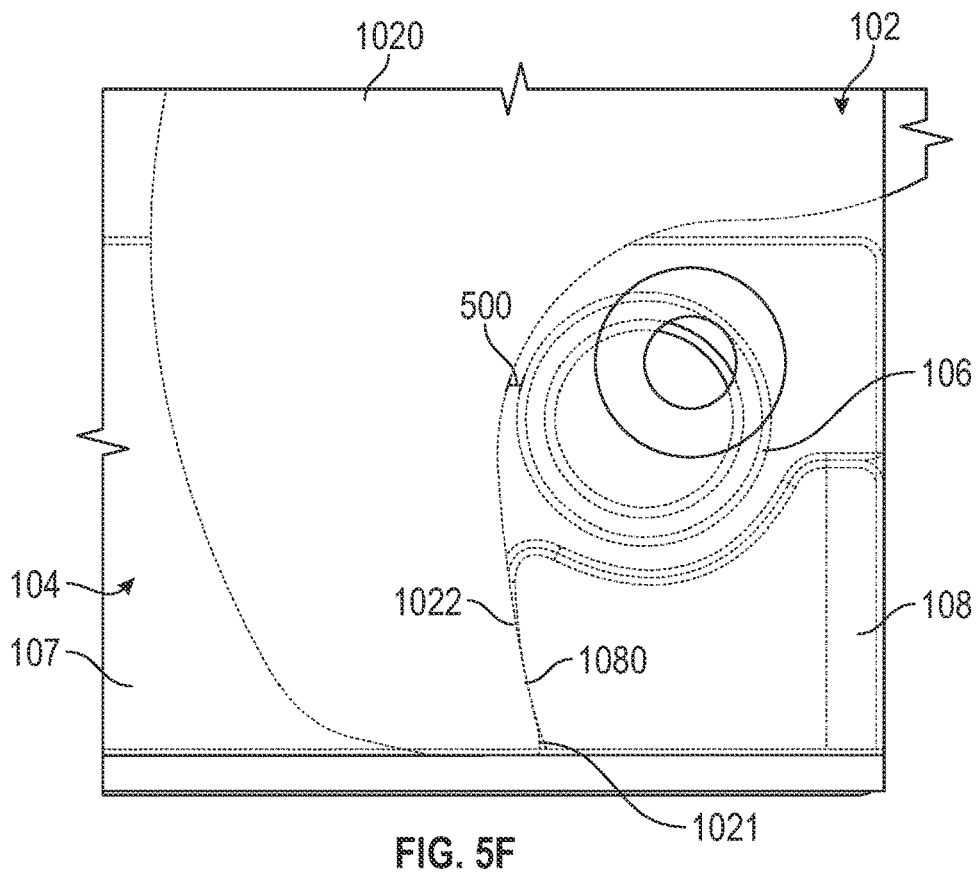

As illustrated in FIG. 5F, when the cam 102 is fully engaged with the fixed guide 108 and in the latched configuration, a gap 500 is formed between the bearing guide 106 and the cam 102 (e.g., the engagement surface 1022 of the cam 102). As such, the cam 102 is prevented from contacting the bearing guide 106 when in the latched configuration. Accordingly, the large impact loads when in the latched configuration are enacted only on the fixed guide 108. If the large impact loads were enacted on the bearing guide 106, as the bearing guide 106 rotates, the engagement would not be as secure. Also, the bearing guide 106 may become damaged.

Figure 6:
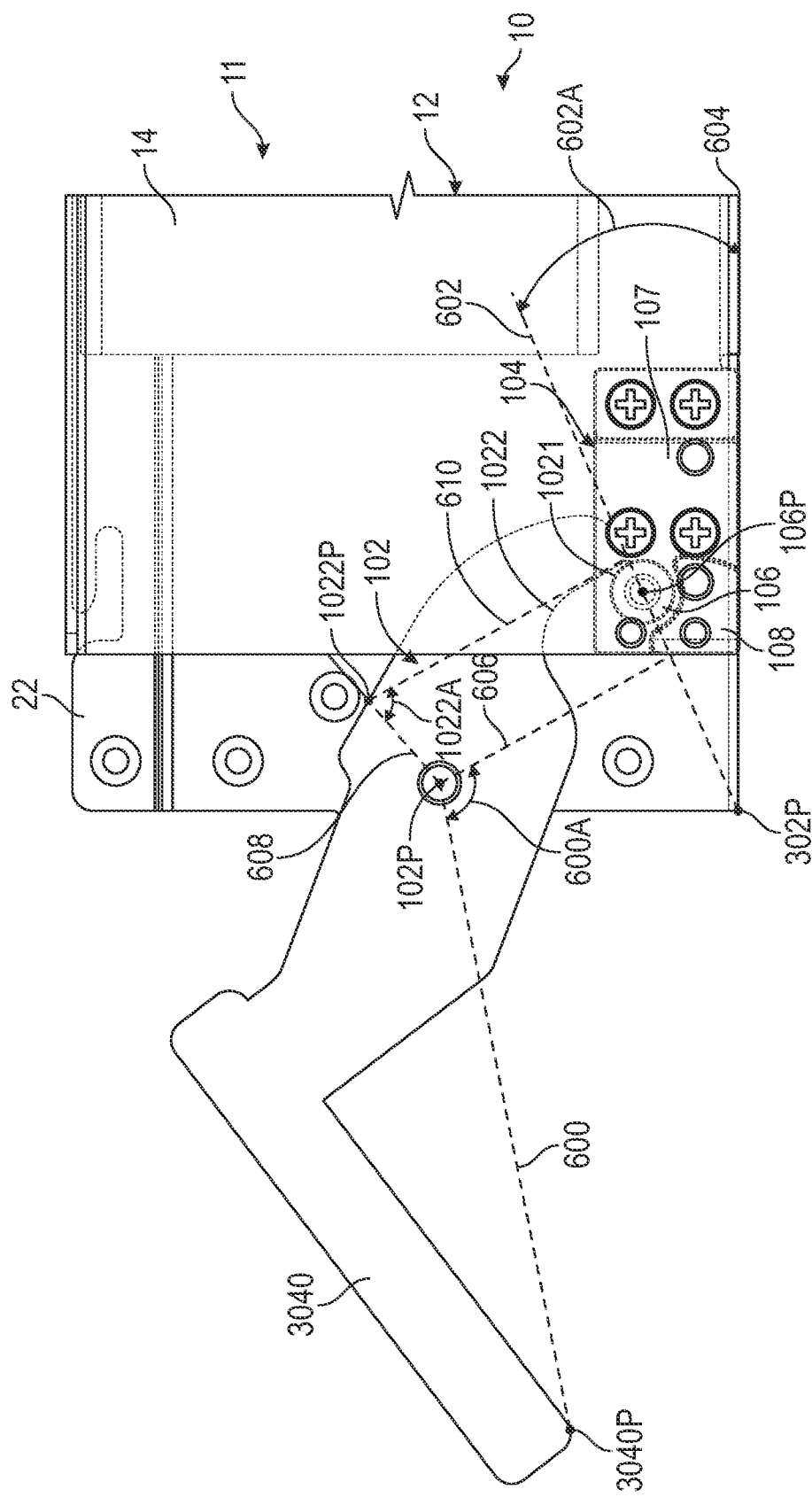
FIG. 6 illustrates dimensions of the cam system.

FIG. 6 illustrates exemplary dimensions of the cam system 100. While the present disclosure discusses the below dimensions, the shape, dimensions, angles, and distances can vary without deviating from the present disclosure to accommodate the desired effects.

A distance 600 between an end point 3040P of the handle portion 3040 and the rotation axis 102P of the cam 102 can be between about 80 millimeters and about 100 millimeters. In some examples, the distance 600 can be about 93.32 millimeters.

A distance 610 can be formed between the tip 1021 of the engagement component 1022 and a cam point 1022P. The cam point 1022P can be determined as the intersection between a line 608 that spans between the rotation axis 102P and the cam point 1022P, and an angle 1022A between the distance 610 and the line 608 can be about 90 degrees. The distance 610 can be between about 30 millimeters and about 40 millimeters. In some examples, the distance 610 can be about 35.90 millimeters.

An angle 602A can be formed between (1) a line 602 that passes from a bottom corner 14P of the side wall 14 of the chassis 12 through a bearing rotation axis 106P, and (2) a line 604 that follows the bottom horizontal surface of the side wall 14 of the chassis 12. In at least one example, the angle 602A can be between 15 degrees and about 27 degrees. In some examples, the angle 602A can be about 21.79 degrees.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A cam system for a liquid cooled computing unit with blind-mate quick disconnects, the cam system comprising:
   a cam;
   a cam guide operable to engage with the cam, the cam guide including a bearing guide and a fixed guide,
   wherein the cam engages first with the bearing guide then engages with the fixed guide to a latched configuration,
   wherein when the cam engages with the cam guide and transitions to the latched configuration, the cam translates a chassis of the computing unit along a longitudinal axis to blind-mate the quick disconnects.

2. The cam system of claim 1, wherein the bearing guide is operable to reduce initial friction loading as the cam engages with the bearing guide.

3. The cam system of claim 1, wherein the bearing guide includes a sleeve bearing and/or a roller bearing.

4. The cam system of claim 1, wherein the cam guide includes a die-cast component coupled with an outer rail of the computing system operable to receive the chassis, wherein the bearing guide is mounted to the die-cast component, and wherein the fixed guide is formed from the die-cast component.

5. The cam system of claim 1, wherein a gap is formed between the bearing guide and the cam such that when the cam is engaged with the fixed guide in the latched configuration, the cam is prevented from contacting the bearing guide.

6. The cam system of claim 1, wherein the cam includes a handle and an engagement component, wherein the engagement component is operable to engage with the cam guide.

7. The cam system of claim 6, wherein the engagement component has an engagement surface with a compound curve so that when the engagement surface of the engagement component engages with the cam guide and transitions to the latched configuration, the cam translates the chassis of the computing unit along the longitudinal axis.

8. The cam system of claim 1, wherein the cam is rotatably coupled with the chassis about a rotation axis so that when the cam engages with the cam guide, the cam is operable to be rotated about the rotation axis to transition to the latched configuration.

9. The cam system of claim 8, wherein when the cam engages with the bearing guide, the cam is operable to be rotated about the rotation axis so that the cam moves along and/or about the bearing guide and then engages with the fixed guide.

10. A liquid cooled computing system comprising:
    a computing unit including a chassis operable to receive one or more computing components including a liquid cooling system with a computing quick disconnect;
    an outer rail operable to receive the chassis such that the chassis is operable to translate on the outer rail along a longitudinal axis;
    a fluid component operable to provide fluid to the liquid cooling system, the fluid component including a fluid quick disconnect operable to couple with the computing quick disconnect to provide the fluid via the computing quick disconnect;
    a cam system including:
      a cam;
      a cam guide operable to engage with the cam, the cam guide including a bearing guide and a fixed guide,
      wherein the cam engages first with the bearing guide then engages with the fixed guide to a latched configuration,
      wherein when the cam engages with the cam guide and transitions to the latched configuration, the cam translates a chassis of the computing unit along a longitudinal axis to couple the computing quick disconnect with the fluid quick disconnect.

11. The computing system of claim 10, wherein the computing quick disconnect is adjacent to a rear end of the chassis such that the computing quick disconnect and the fluid quick disconnect are blind-mate quick disconnects, wherein the cam system is adjacent a front end of the chassis opposite the rear end of the chassis.

12. The computing system of claim 10, wherein the bearing guide is operable to reduce initial friction loading as the cam engages with the bearing guide and the computing quick disconnect engages with the fluid quick disconnect.

13. The computing system of claim 10, wherein the bearing guide includes a sleeve bearing and/or a roller bearing.

14. The computing system of claim 10, wherein the cam guide includes a die-cast component coupled with an outer rail of the computing system operable to receive the chassis, wherein the bearing guide is mounted to the die-cast component, and wherein the fixed guide is formed from the die-cast component.

15. The computing system of claim 10, wherein a gap is formed between the bearing guide and the cam such that when the cam is engaged with the fixed guide in the latched configuration, the cam is prevented from contacting the bearing guide.

16. The computing system of claim 10, wherein the cam includes a handle and an engagement component, wherein the engagement component is operable to engage with the cam guide.

17. The computing system of claim 16, wherein the engagement component has an engagement surface with a compound curve so that when the engagement surface of the engagement component engages with the cam guide and transitions to the latched configuration, the cam translates the chassis of the computing unit along the longitudinal axis.

18. The computing system of claim 10, wherein the cam is rotatably coupled with the chassis about a rotation axis so that when the cam engages with the cam guide, the cam is operable to be rotated about the rotation axis to transition to the latched configuration.

19. The computing system of claim 18, wherein when the cam engages with the bearing guide, the cam is operable to be rotated about the rotation axis so that the cam moves along and/or about the bearing guide and then engages with the fixed guide.

* * * * *